(12) United States Patent
Chan et al.

(10) Patent No.: US 12,283,610 B2
(45) Date of Patent: Apr. 22, 2025

(54) STRUCTURE AND FORMATION METHOD OF SEMICONDUCTOR DEVICE WITH EPITAXIAL STRUCTURES

(71) Applicant: Taiwan Semiconductor Manufacturing Company, Ltd., Hsinchu (TW)

(72) Inventors: Chien-Tai Chan, Hsinchu (TW); Yu-Ching Huang, Taipei (TW); Chien-Chih Lin, Taichung (TW); Hsueh-Jen Yang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 410 days.

(21) Appl. No.: 17/746,337

(22) Filed: May 17, 2022

(65) Prior Publication Data

US 2023/0378268 A1    Nov. 23, 2023

(51) Int. Cl.
*H01L 29/423* (2006.01)
*H01L 29/08* (2006.01)
*H01L 29/66* (2006.01)
*H01L 29/786* (2006.01)
*H01L 29/06* (2006.01)

(52) U.S. Cl.
CPC .... *H01L 29/0847* (2013.01); *H01L 29/66545* (2013.01); *H01L 29/66553* (2013.01); *H01L 29/66742* (2013.01); *H01L 29/78621* (2013.01); *H01L 29/78696* (2013.01); *H01L 29/0665* (2013.01); *H01L 29/42392* (2013.01)

(58) Field of Classification Search
CPC ........... H01L 29/0847; H01L 29/66545; H01L 29/66553; H01L 29/66742; H01L 29/78621; H01L 29/78696; H01L 29/0665; H01L 29/42392; H01L 29/0646; H01L 29/66439; H01L 29/6656; H01L 29/7848; H01L 29/775; H01L 29/165; H01L 29/0673; B82Y 10/00
See application file for complete search history.

(56) References Cited

U.S. PATENT DOCUMENTS

| | | | |
|---|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsal et al. |

(Continued)

*Primary Examiner* — David Vu
(74) *Attorney, Agent, or Firm* — Birch, Stewart, Kolasch & Birch, LLP

(57) ABSTRACT

A semiconductor device structure and a formation method are provided. The method includes forming a protruding structure over a substrate. The protruding structure has multiple sacrificial layers and multiple semiconductor layers, and the sacrificial layers and the semiconductor layers have an alternating configuration. The method also includes forming a gate stack to wrap a portion of the protruding structure. The method further includes forming an epitaxial structure abutting edges of the semiconductor layers. The formation of the epitaxial structure includes forming a lower semiconductor portion on a bottom of the recess and forming an upper semiconductor portion over the lower semiconductor portion. The upper semiconductor portion and the lower semiconductor portion are oppositely doped.

20 Claims, 12 Drawing Sheets

(56) References Cited

U.S. PATENT DOCUMENTS

| | | |
|---|---|---|
| 9,093,514 B2 | 7/2015 | Tsai et al. |
| 9,236,267 B2 | 1/2016 | De et al. |
| 9,425,805 B2 | 1/2016 | Yeh et al. |
| 9,520,482 B1 | 12/2016 | Chang et al. |
| 9,576,814 B2 | 2/2017 | Wu et al. |
| 11,233,122 B2 * | 1/2022 | Kim .................. H01L 29/78696 |

* cited by examiner

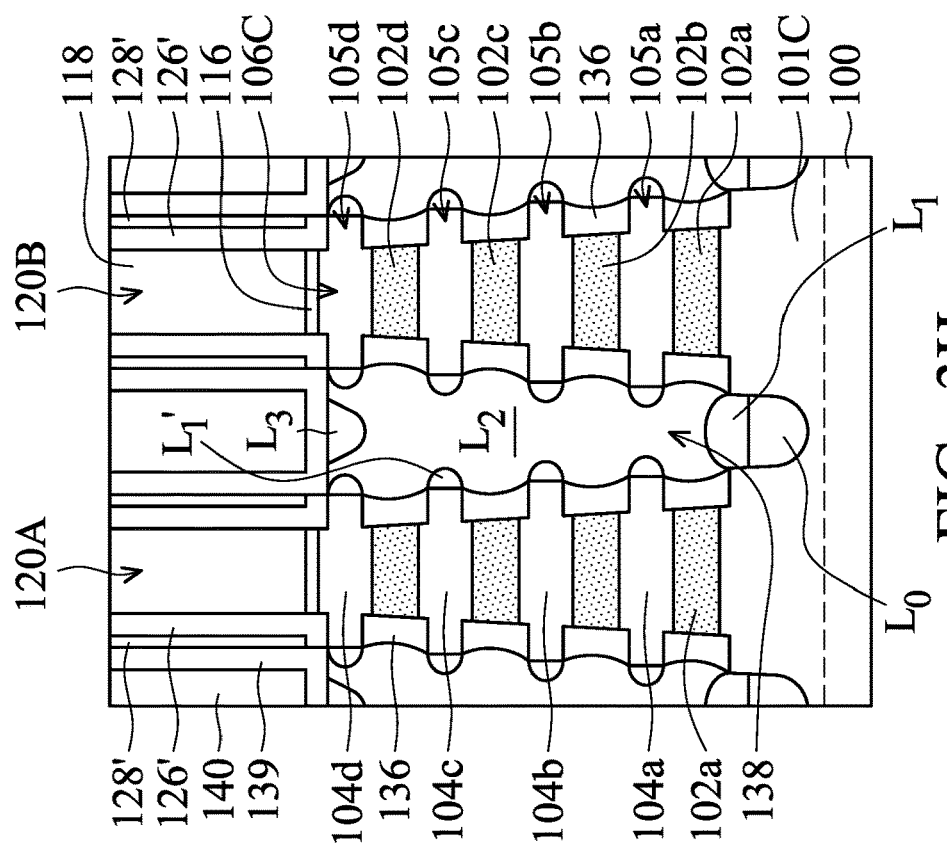
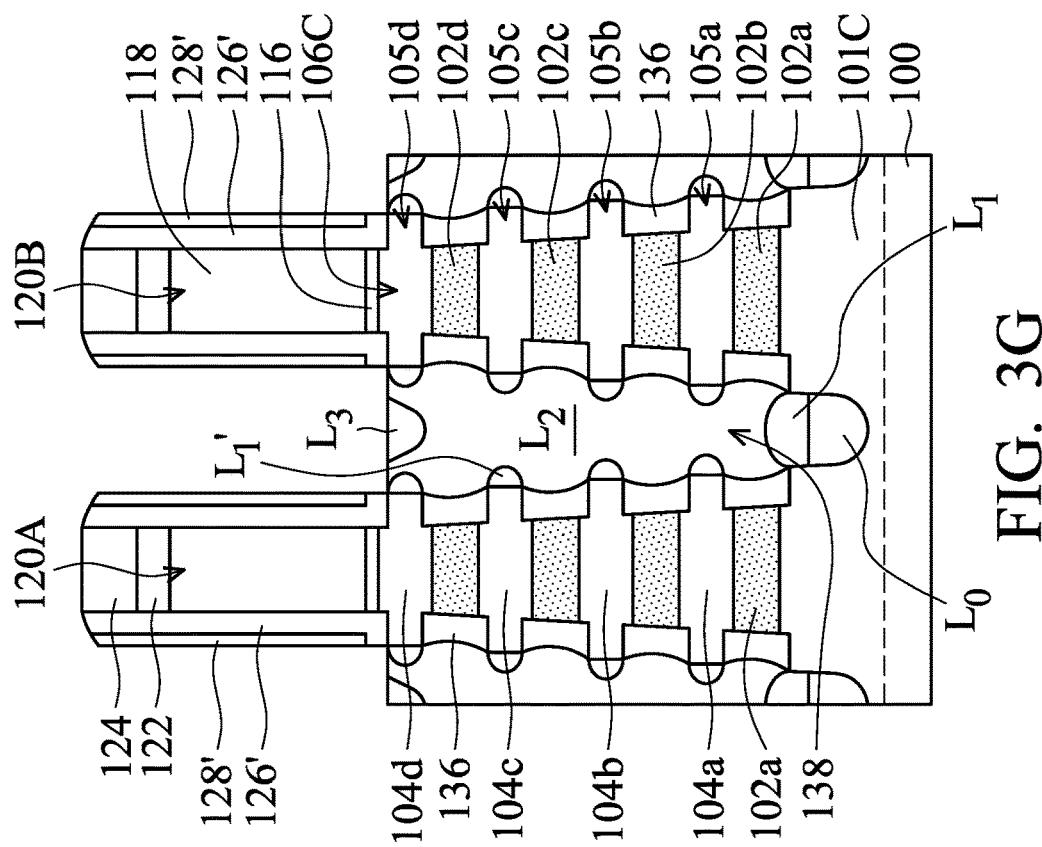

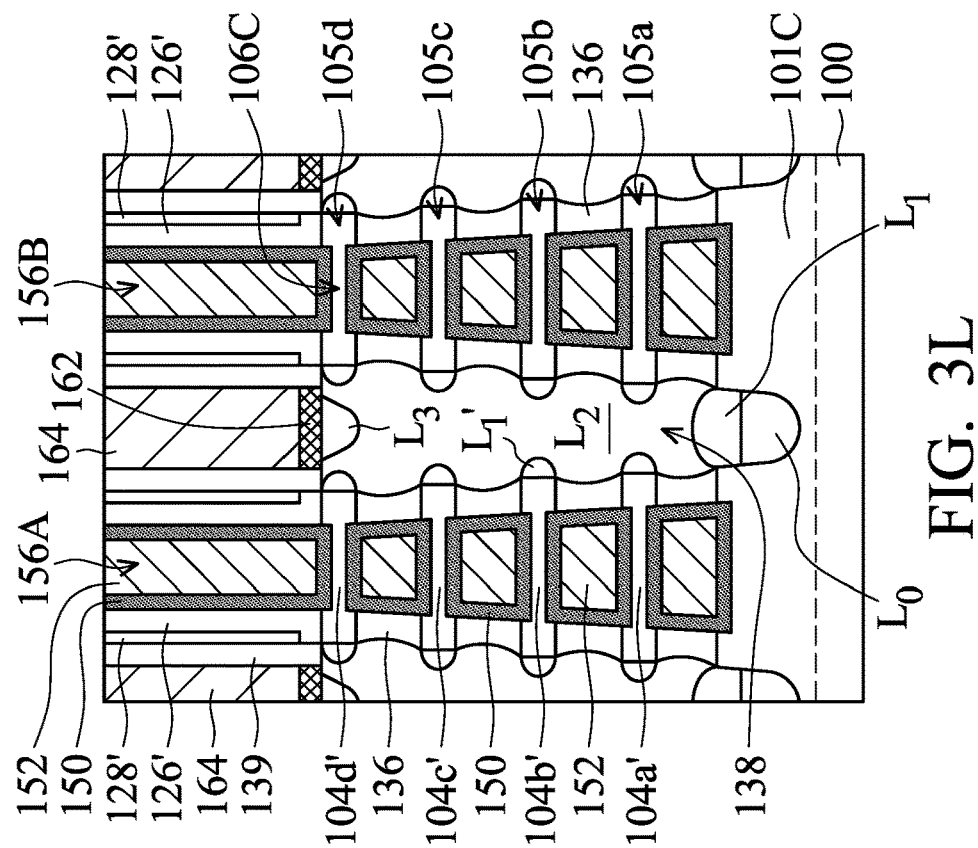
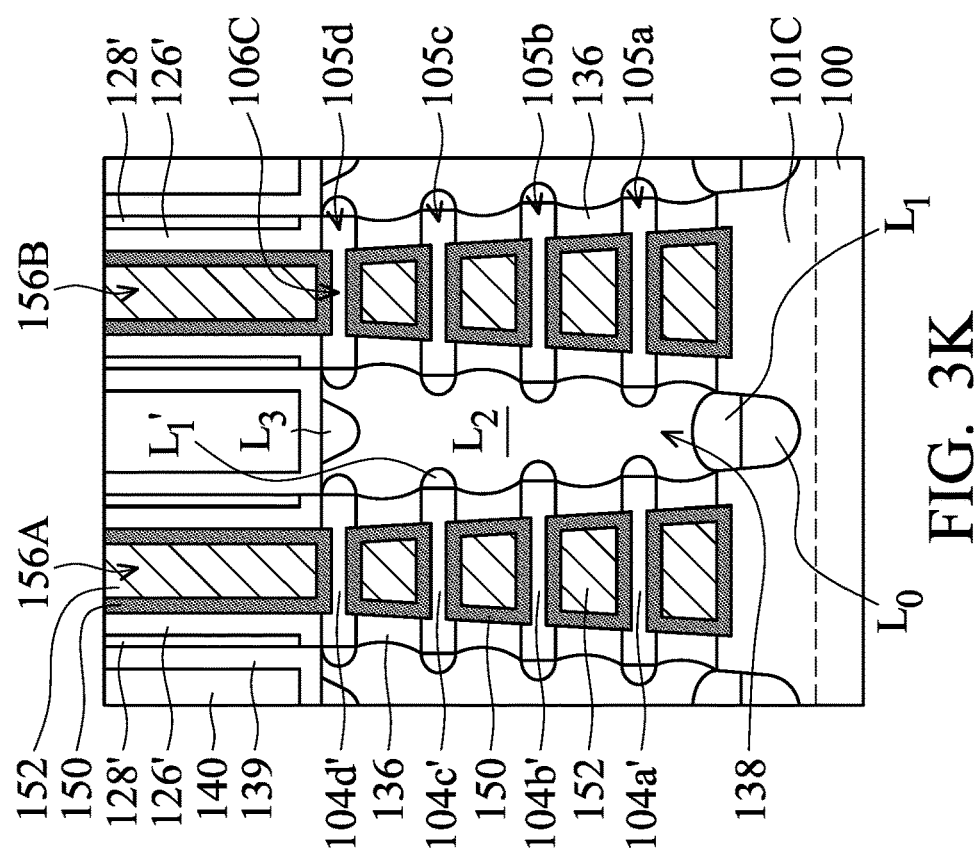
FIG. 3K
FIG. 3L

STRUCTURE AND FORMATION METHOD OF SEMICONDUCTOR DEVICE WITH EPITAXIAL STRUCTURES

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A-3L are cross-sectional views of various stages of a process for forming a portion of a semiconductor device structure, in accordance with some embodiments.

DETAILED DESCRIPTION

Figure 1A:
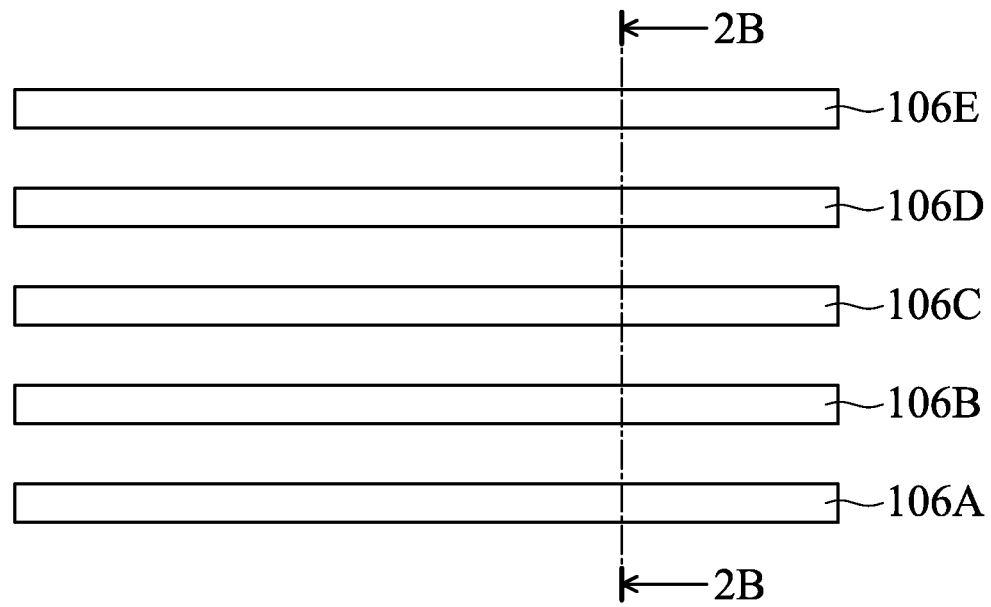
FIGS. 1A-1B are top views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100% of what is specified. Furthermore, terms such as "substantially parallel" or "substantially perpendicular" are to be interpreted as not to exclude insignificant deviation from the specified arrangement and may include for example deviations of up to 10 degrees in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% of what is specified in some embodiments. The term "about" in relation to a numerical value x may mean x±5 or 10% of what is specified in some embodiments.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
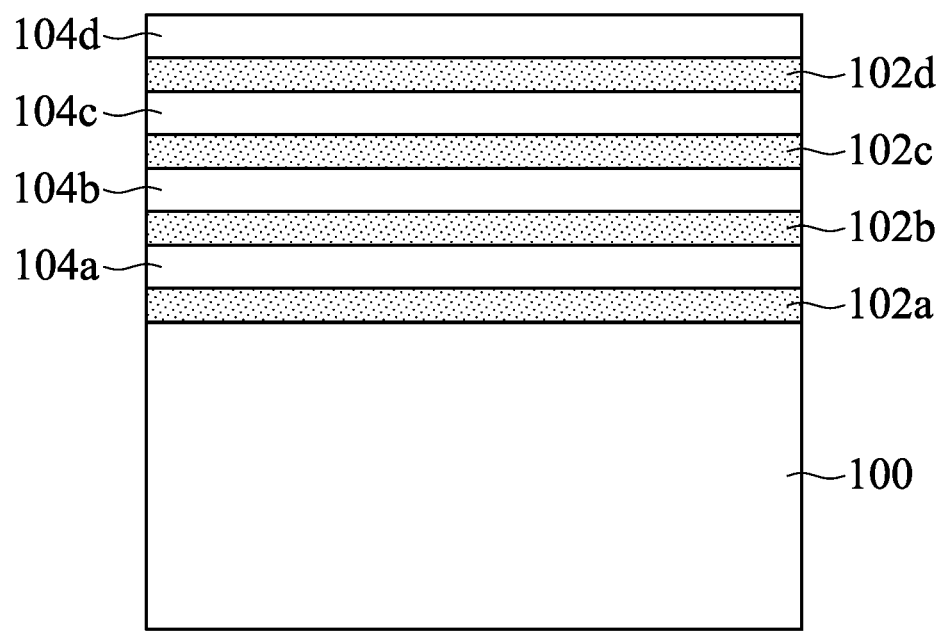
FIGS. 2A-2D are cross-sectional views of various stages of a process for forming a portion of a semiconductor device structure, in accordance with some embodiments.

FIGS. 2A-2D are cross-sectional views of various stages of a process for forming a portion of a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102a, 102b, 102c, and 102d. The semiconductor stack also includes multiple semiconductor layers 104a, 104b, 104c, and 104d. In some embodiments, the semiconductor layers 102a-102d and the semiconductor layers 104a-104d are laid out alternately, as shown in FIG. 2A. The semiconductor layers 102a-102d and the semiconductor layers 104a-104d have an alternating configuration, as shown in FIG. 2A.

In some embodiments, the semiconductor layers 102a-102d function as sacrificial layers that will be removed in a subsequent process to release the semiconductor layers 104a-104d. The semiconductor layers 104a-104d that are released may function as channel structures of one or more transistors.

In some embodiments, the semiconductor layers 104a-104d that will be used to form channel structures are made of a material that is different than that of the semiconductor layers 102a-102d. In some embodiments, the semiconductor layers 104a-104d are made of or include silicon, germanium, other suitable materials, or a combination thereof. In some embodiments, the semiconductor layers 102a-102d are made of or include silicon germanium. In some other embodiments, the semiconductor layers 104a-104d are made of silicon germanium, and the semiconductor layers 102a-102d are made of silicon germanium with different atomic concentration of germanium than that of the semiconductor layers 104a-104d. As a result, different etching selectivity and/or different oxidation rates during subsequent processing may be achieved between the semiconductor layers 102a-102d and the semiconductor layers 104a-104d.

The present disclosure contemplates that the semiconductor layers 102a-102d and the semiconductor layers 104a-104d include any combination of semiconductor materials that can provide desired etching selectivity, desired oxidation rate differences, and/or desired performance characteristics (e.g., materials that maximize current flow).

In some embodiments, the semiconductor layers 102a-102d and 104a-104d are formed using multiple epitaxial growth operations. Each of the semiconductor layers 102a-102d and 104a-104d may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the semiconductor layers 102a-102d and 104a-104d are grown in-situ in the same process chamber. In some embodiments, the growth of the semiconductor layers 102a-102d and 104a-104d are alternately and sequentially performed in the same process chamber to complete the formation of the semiconductor stack. In some embodiments, the vacuum of the process chamber is not broken before the epitaxial growth of the semiconductor stack is accomplished.

Afterwards, hard mask elements are formed over the semiconductor stack to assist in a subsequent patterning of the semiconductor stack. Each of the hard mask elements may include a first mask layer 108 and a second mask layer 110. The first mask layer 108 and the second mask layer 110 may be made of different materials. One or more photolithography processes and one or more etching processes are used to pattern the semiconductor stack into multiple fin structures 106A, 106B, 106C, 106D, and 106E. The fin structures 106A-106E may be patterned by any suitable method. For example, the fin structures 106A-106E may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

Figure 2B:
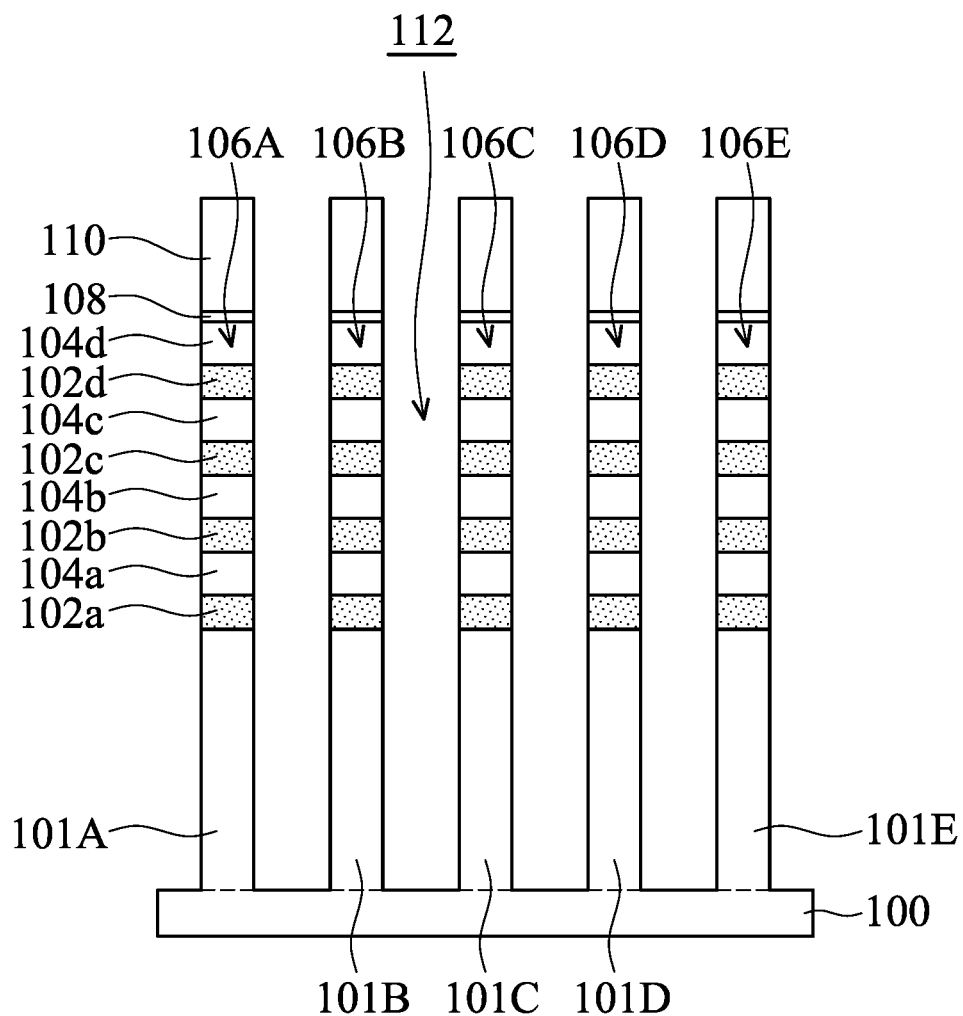

The semiconductor stack is partially removed to form multiple trenches 112, as shown in FIG. 2B. Each of the fin structures may include portions of the semiconductor layers 102a-102d and 104a-104d and multiple semiconductor fins 101A, 101B, 101C. 101D, and 101E, as shown in FIG. 2B. The semiconductor substrate 100 may also be partially removed during the etching process that forms the fin structures 106A-106E. Protruding portions of the semiconductor substrate 100 that remain form the semiconductor fins 101A-101E.

Figure 1B:
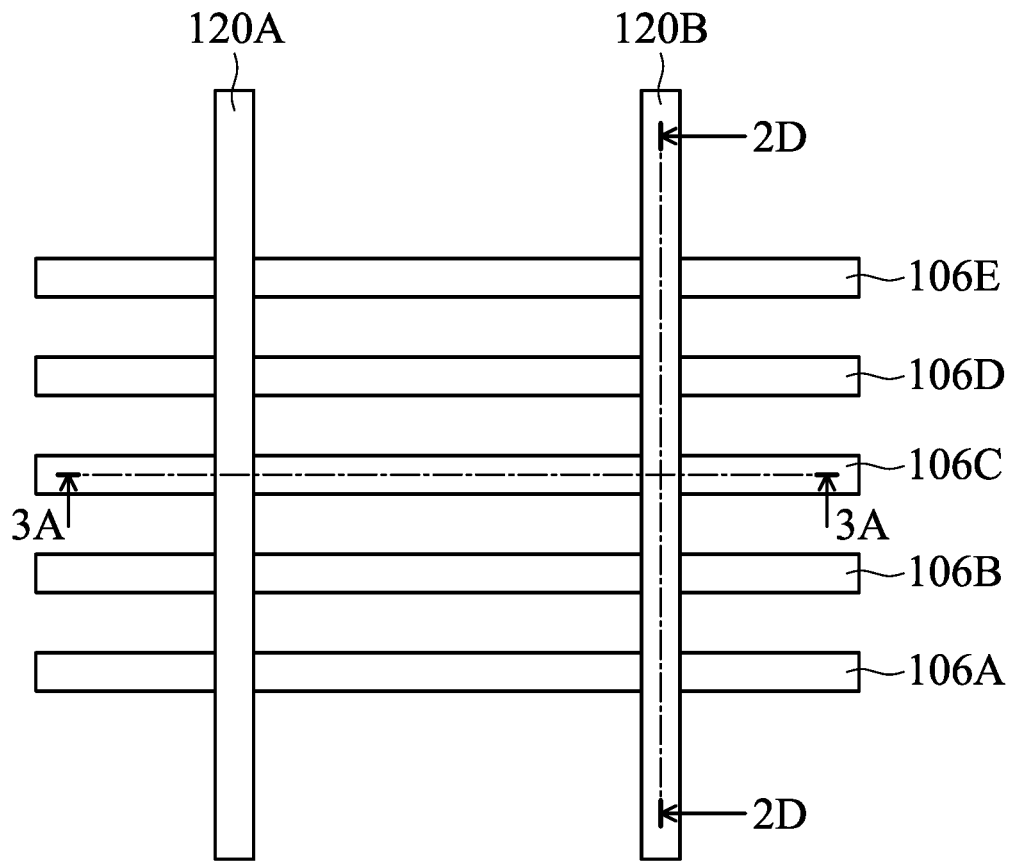

FIGS. 1A-1B are top views of various stages of a process for forming a portion of a semiconductor device structure, in accordance with some embodiments. As shown in FIG. 1A, multiple fin structures 106A-106E are formed, in accordance with some embodiments. In some embodiments, the fin structures 106A-106E are oriented lengthwise. In some embodiments, the extending directions of the fin structures 106A-106E are substantially parallel to each other, as shown in FIG. 1A. In some embodiments, FIG. 2B is a cross-sectional view of the structure taken along the line 2B-2B in FIG. 1A.

Figure 2C:
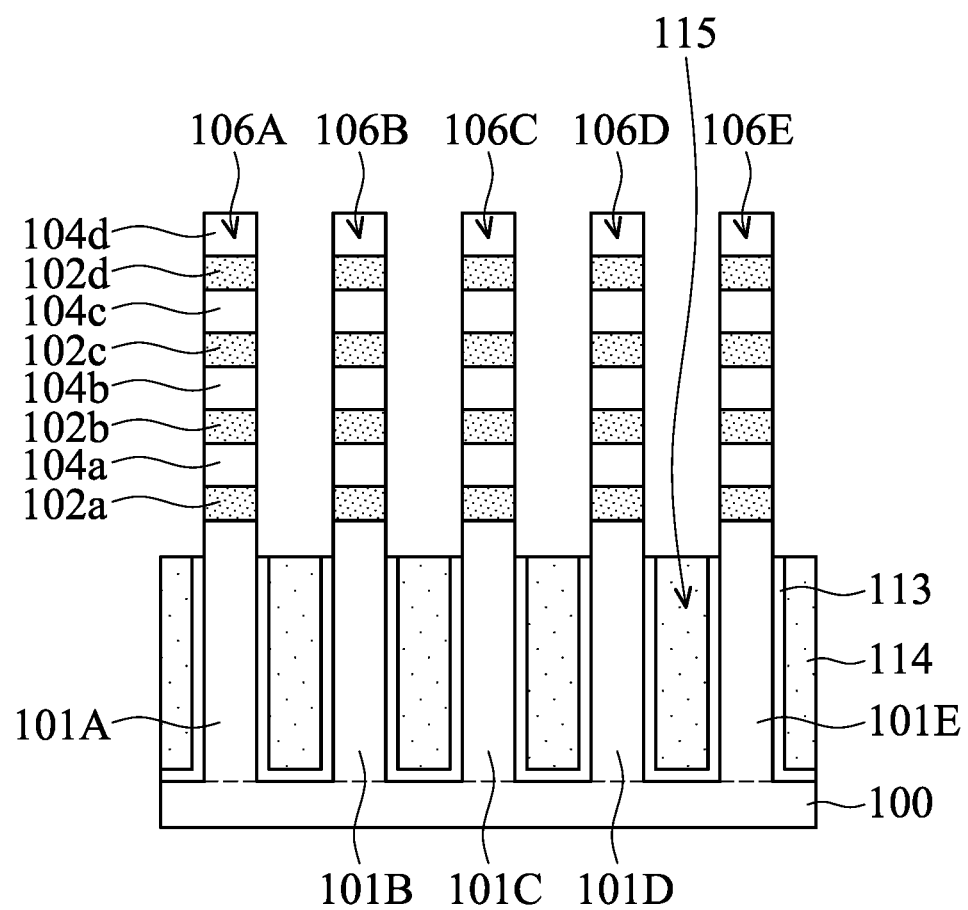

Afterwards, as shown in FIG. 2C, an isolation structure 115 is formed to surround lower portions of the fin structures 106A-106E, in accordance with some embodiments. In some embodiments, the isolation structure 115 includes dielectric fillings 114 and a liner layer 113 that is adjacent to the semiconductor fins 101A-101E.

In some embodiments, one or more dielectric layers are deposited over the fin structures 106A-106E and the semiconductor substrate 100. The dielectric layers for forming the dielectric fillings 114 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

The liner layer 113 may be made of or include silicon nitride, silicon oxynitride, silicon carbide, silicon oxycarbide, one or more other suitable materials, or a combination thereof. The dielectric layers and the liner layer 113 may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers and the liner layer 113. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof.

Afterwards, one or more etching back processes are used to partially remove the dielectric layers and the liner layer 113. As a result, the remaining portion of the dielectric layers forms the dielectric fillings 114 of the isolation structure 115. Upper portions of the fin structures 106A-106E protrude from the top surface of the isolation structure 115, as shown in FIG. 2C.

In some embodiments, the etching back process for forming the isolation structure 115 is carefully controlled to ensure that the topmost surface of the isolation structure 115 is positioned at a suitable height level, as shown in FIG. 2C. In some embodiments, the topmost surface of the isolation structure 115 is below the bottommost surface of the semiconductor layer 102a that functions as a sacrificial layer.

Afterwards, the hard mask elements (including the first mask layer 108 and the second mask layer 110) are removed. Alternatively, in some other embodiments, the hard mask elements are removed or consumed during the planarization process and/or the etching back process that forms the isolation structure 115.

Figure 2D:
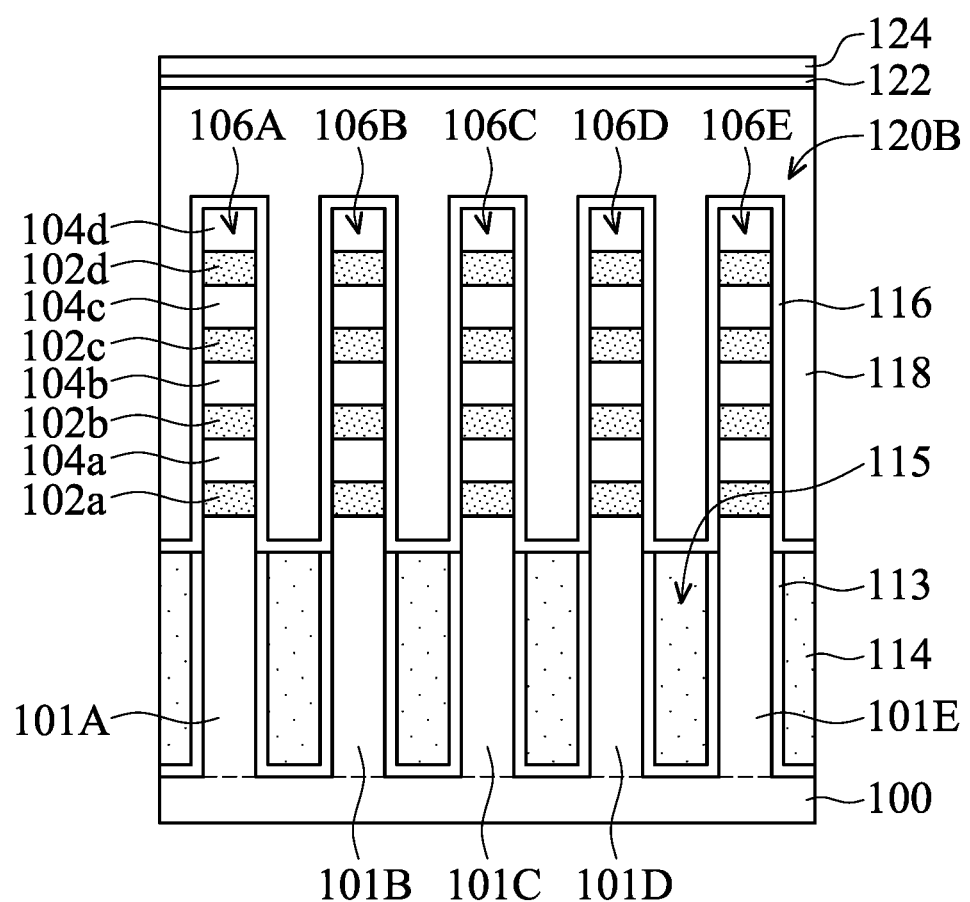

Afterwards, dummy gate stacks 120A and 120B are formed to extend across the fin structures 106A-106E, as shown in FIG. 1B in accordance with some embodiments. In some embodiments, FIG. 2D is a cross-sectional view of the structure taken along the line 2D-2D in FIG. 1B. FIGS. 3A-3L are cross-sectional views of various stages of a process for forming a portion of a semiconductor device structure, in accordance with some embodiments. In some embodiments, FIG. 3A is a cross-sectional view of the structure taken along the lines 3A-3A in FIG. 1B.

As shown in FIGS. 1B, 2D, and 3A, the dummy gate stacks 120A and 120B are formed to partially cover and to extend across the fin structures 106A-106E, in accordance with some embodiments. In some embodiments, the dummy gate stacks 120A and 120B wraps around the fin structures 106A-106E. As shown in FIG. 2D, the dummy gate stack 120B extends across and is wrapped around the fin structures 106A-106E. As shown in FIG. 1B, other portions of the fin structures 106A-106E are exposed without being covered by the dummy gate stacks 120A and 120B.

As shown in FIGS. 2D and 3A, each of the dummy gate stacks 120A and 120B includes a dummy gate dielectric layer 116 and a dummy gate electrode 118. The dummy gate dielectric layer 116 may be made of or include silicon oxide or another suitable material. The dummy gate electrodes 118 may be made of or include polysilicon or another suitable material.

In some embodiments, a dummy gate dielectric material layer and a dummy gate electrode layer are sequentially deposited over the isolation structure 115 and the fin structures 106A-106E. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks 120A and 120B.

In some embodiments, hard mask elements including mask layers 122 and 124 are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate stacks 120A and 120B.

Figure 3B:
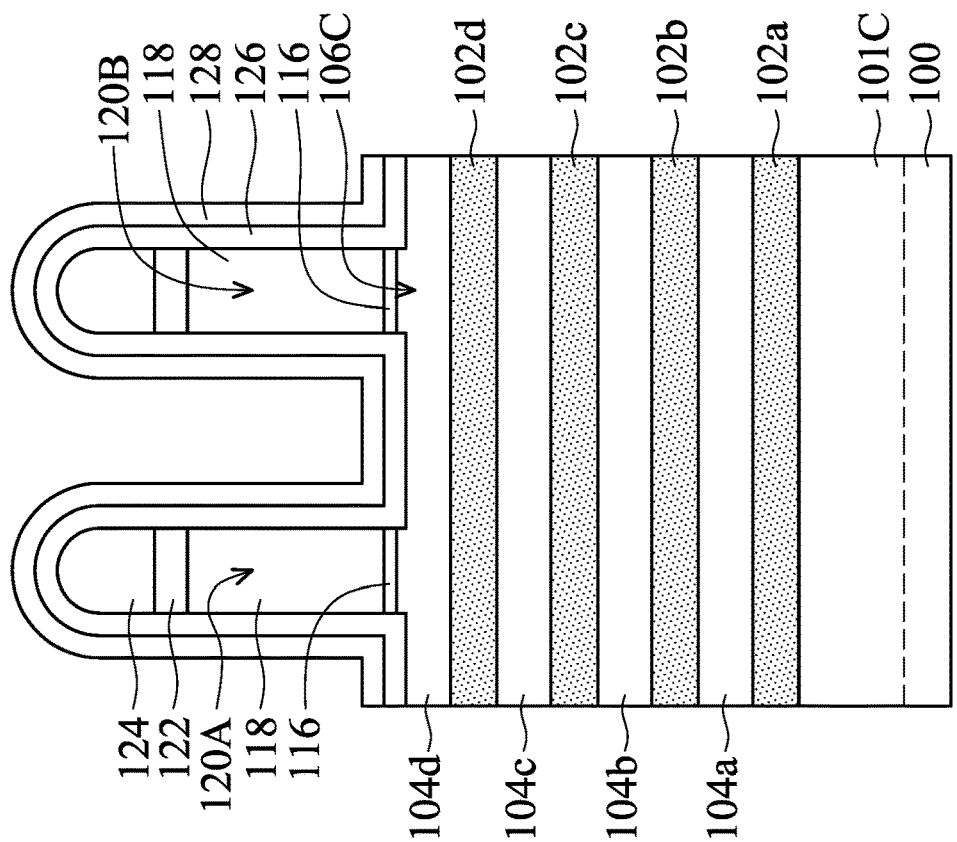
Figure 3A:
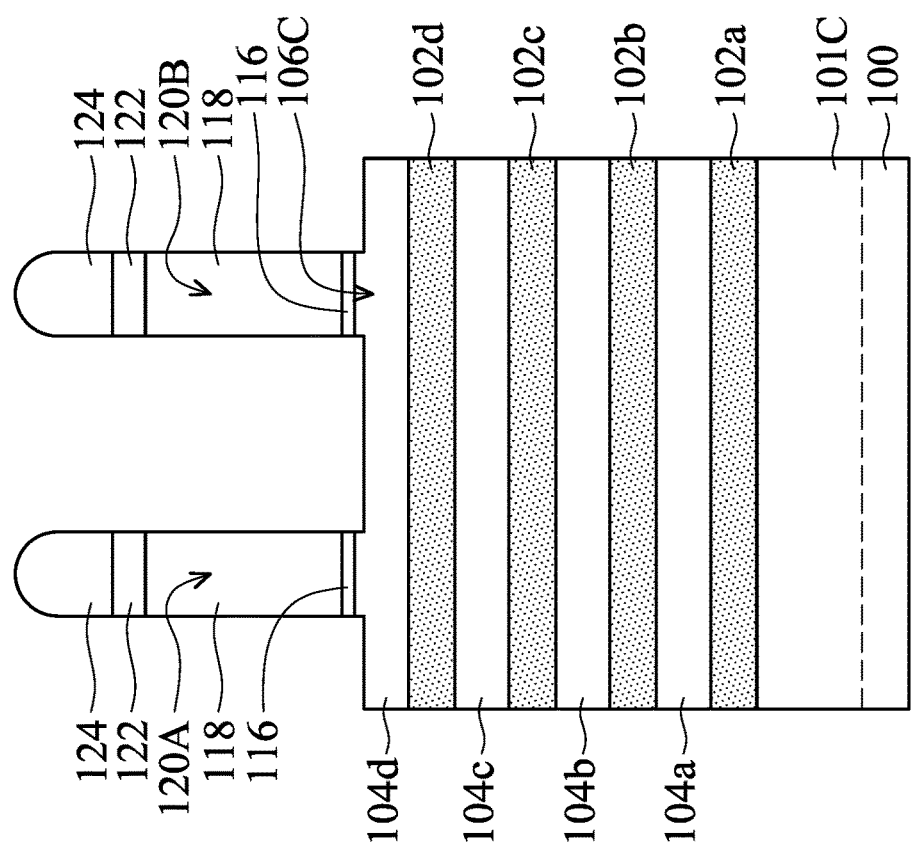

As shown in FIG. 3B, spacer layers 126 and 128 are then deposited over the dummy gate stacks 120A and 120B and the fin structure 106C, in accordance with some embodiments. The spacer layers 126 and 128 extend along the tops and sidewalls of the dummy gate stacks 120A and 120B, as shown in FIG. 3B.

In some embodiments, the spacer layers 126 and 128 are made of different materials. The spacer layer 126 may be made of a dielectric material that has a low dielectric constant. The spacer layer 126 may be made of or include silicon carbide, silicon oxycarbide, carbon-containing silicon oxynitride, silicon oxide, one or more other suitable materials, or a combination thereof. In some embodiments, the spacer layer 126 is a single layer. In some other embodiments, the spacer layer 126 includes multiple sub-layers. Some of the sub-layers may be made of different materials. Some of the sub-layers may be made of similar materials with different compositions. For example, one of the sub-layers may have a greater atomic concentration of carbon than other sub-layers.

The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

However, embodiments of the disclosure are not limited thereto. Many variations and/or modifications can be made to embodiments of the disclosure. In some other embodiments, the spacer layers 126 and 128 are made of the same material.

Figures 3C, 3D:
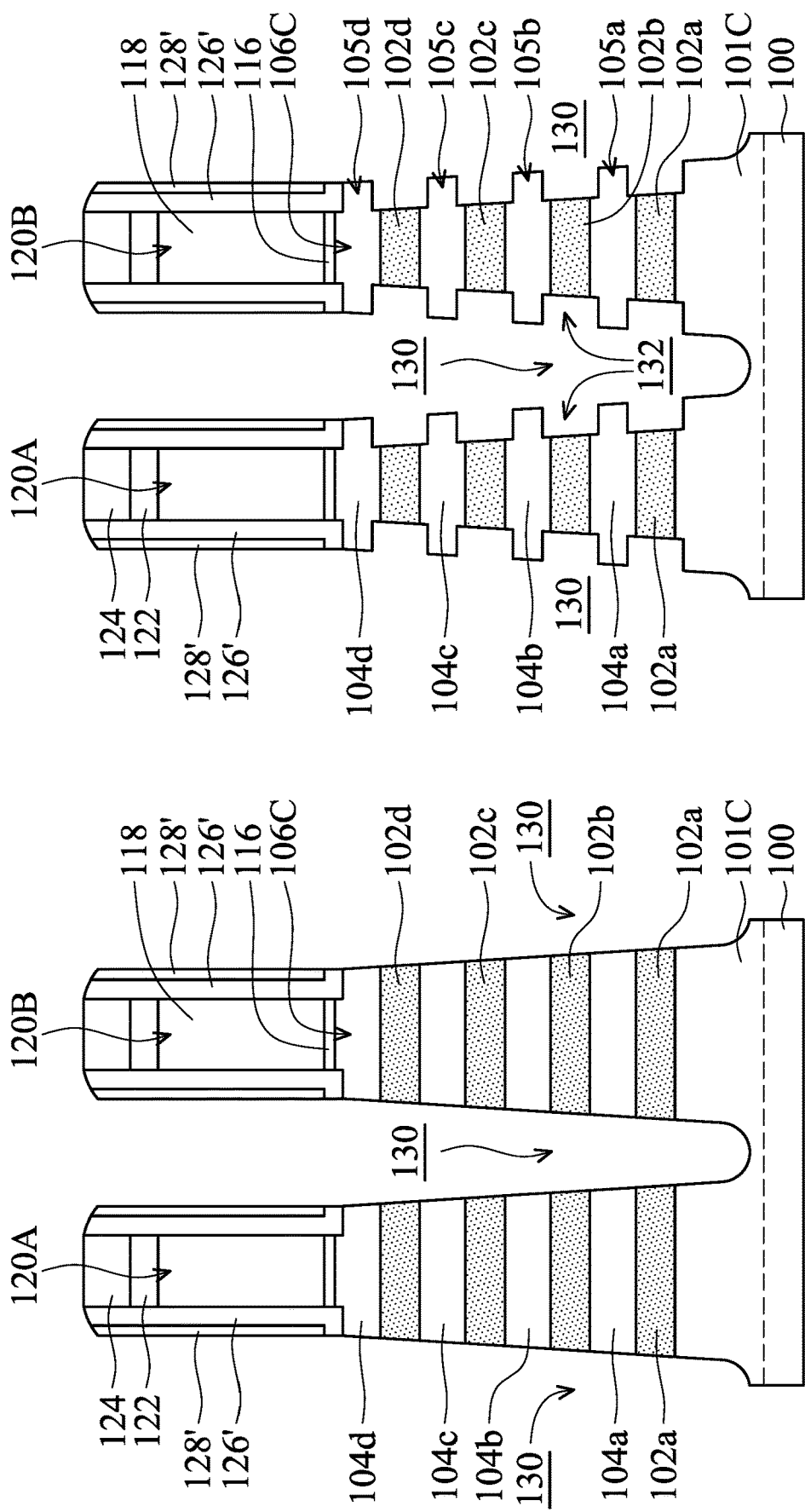

As shown in FIG. 3C, the spacer layers 126 and 128 are partially removed, in accordance with some embodiments. One or more anisotropic etching processes may be used to partially remove the spacer layers 126 and 128. As a result, remaining portions of the spacer layers 126 and 128 form spacer elements 126' and 128', respectively. The spacer elements 126' and 128' extend along the sidewalls of the dummy gate stacks 120A and 120B, as shown in FIG. 3C.

Afterwards, the fin structures including the fin structure 106C are partially removed, in accordance with some embodiments. As a result, the recesses 130 are formed, as shown in FIG. 3C. The recesses 130 may be used to contain epitaxial structures (such as source/drain structures) that will be formed later. One or more etching processes may be used to form the recesses 130. In some embodiments, a dry etching process is used to form the recesses 130. Alternatively, a wet etching process may be used to form the recesses 130. In some embodiments, the recesses 130 penetrate into the fin structure 106C. In some embodiments, the recesses 130 further extend into the semiconductor fin 101C, as shown in FIG. 3C. In some embodiments, the spacer elements 126' and 128' and the recesses 130 are formed simultaneously using the same etching process.

In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104d) is shorter than a lower semiconductor layer (such as the semiconductor layer 104b).

However, embodiments of the disclosure have many variations. In some other embodiments, the recesses 130 have substantially vertical sidewalls. In these cases, due to the profile of the recesses 130, an upper semiconductor layer (such as the semiconductor layer 104d) is substantially as wide as a lower semiconductor layer (such as the semiconductor layer 104b).

Afterwards, as shown in FIG. 3D, the semiconductor layers 102a-102d are laterally etched, in accordance with some embodiments. As a result, edges of the semiconductor layers 102a-102d retreat from edges of the semiconductor layers 104a-104d. As shown in FIG. 3D, recesses 132 are formed due to the lateral etching of the semiconductor layers 102a-102d. The recesses 132 may be used to contain inner spacers that will be formed later. The semiconductor layers 102a-102d may be laterally etched using a wet etching process, a dry etching process, or a combination thereof. In some other embodiments, the semiconductor layers 102a-102d are partially oxidized before being laterally etched.

During the lateral etching of the semiconductor layers 102a-102d, the semiconductor layers 104a-104d may also be slightly etched. As a result, edge portions of the semiconductor layers 104a-104d are partially etched and thus shrink to become edge elements 105a-105d, as shown in FIG. 3D. As shown in FIG. 3D, each of the edge elements 105a-105d of the semiconductor layers 104a-104d is thinner than the corresponding inner portion of the semiconductor layers 104a-104d.

Figure 3F:
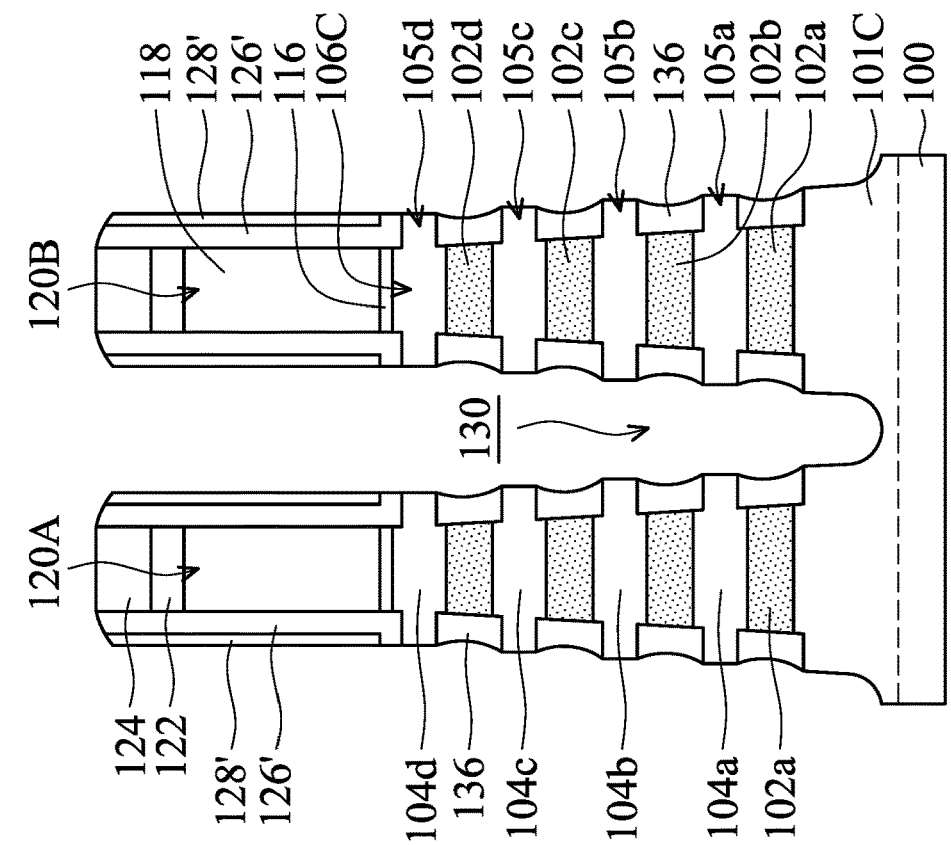
Figure 3E:
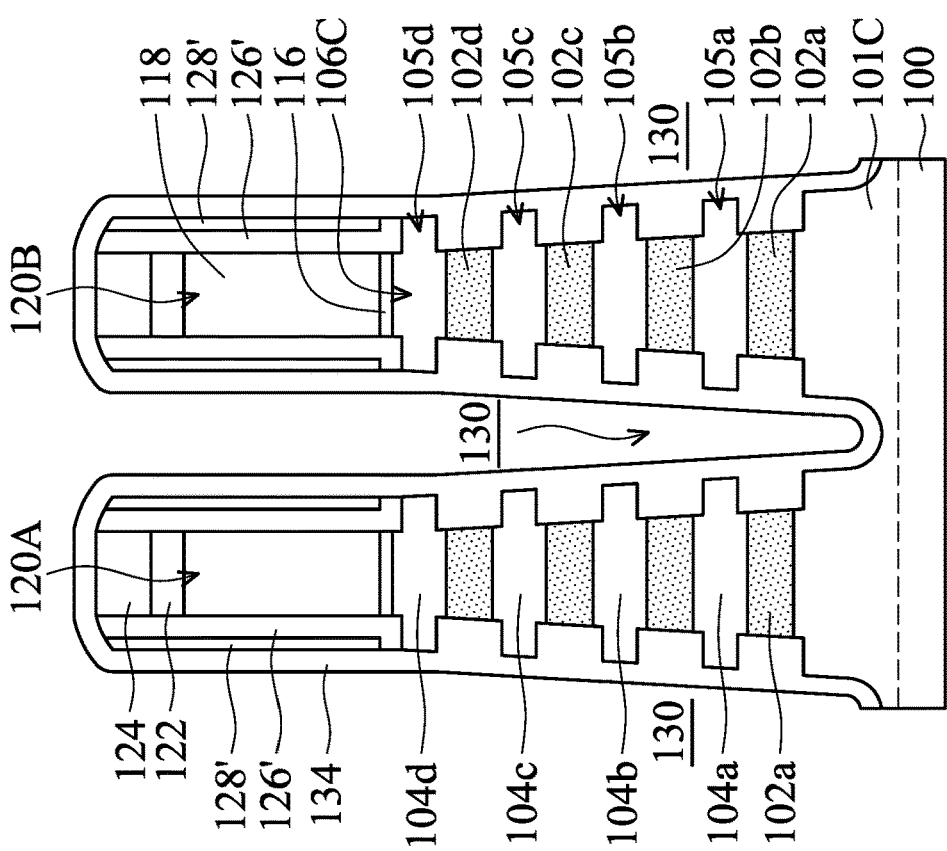

As shown in FIG. 3E, an insulating layer 134 is deposited over the structure shown in FIG. 3D, in accordance with some embodiments. The insulating layer 134 covers the dummy gate stacks 120A and 120B and fills the recesses 132. The insulating layer 134 may be made of or include carbon-containing silicon nitride (SiCN), carbon-containing silicon oxynitride (SiOCN), carbon-containing silicon oxide (SiOC), silicon oxide, silicon nitride, one or more other suitable materials, or a combination thereof. In some embodiments, the insulating layer 134 is a single layer. In some other embodiments, the insulating layer 134 includes multiple sub-layers. Some of the sub-layers may be made of different materials and/or contain different compositions. The insulating layer 134 may be deposited using a CVD process, an ALD process, one or more other applicable processes, or a combination thereof.

As shown in FIG. 3F, an etching process is used to partially remove the insulating layer 134, in accordance with some embodiments. The portions of the insulating layer 134 outside of the recesses 132 may be removed. The remaining portions of the insulating layer 134 form inner spacers 136, as shown in FIG. 3F. The etching process may include a dry etching process, a wet etching process, or a combination thereof.

The inner spacers 136 cover the edges of the semiconductor layers 102a-102d. The inner spacers 136 may be used to prevent subsequently formed epitaxial structures (that function as, for example, source/drain structures) from being damaged during a subsequent process for removing the sacrificial layers 102a-102d. In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fin 101C originally covered by the insulating layer 134 are exposed by the recesses 130, as shown in FIG. 3F. The edges of the semiconductor layers 104a-104d are also exposed by the recesses 130, as shown in FIG. 3F.

As shown in FIG. 3G, epitaxial structures 138 are formed in the recesses 130, in accordance with some embodiments. In some other embodiments, the epitaxial structures 138 overfill the recesses 130 to ensure fully contact between the epitaxial structures 138 and the semiconductor layers 104d. In some embodiments, the top surfaces of the epitaxial structures 138 are higher than the top surface of the dummy gate dielectric layer 116. In some other embodiments, the epitaxial structures 138 partially fill the recesses 130.

In some embodiments, the epitaxial structures 138 connect to the semiconductor layers 104a-104d. Portions of the semiconductor layers 104a-104d that will be function as channel structures are sandwiched between two respective epitaxial structures 138, as shown in FIG. 3G. In some embodiments, the epitaxial structures 138 are designed to function as source/drain structures of p-channel field-effect transistors (PFET). The epitaxial structures 138 may include epitaxially grown silicon germanium (SiGe), epitaxially grown silicon, or another suitable epitaxially grown semiconductor material. In some other embodiments, the epitaxial structures 138 are designed to function as source/drain structures of n-channel field-effect transistors (NFET). The epitaxial structures 138 may include epitaxially grown silicon or another suitable epitaxially grown semiconductor material.

In some embodiments, each of the epitaxial structures 138 includes a bottom semiconductor portion $L_0$, a lower semiconductor portion $L_1$, and an upper semiconductor portion $L_2$, as shown in FIG. 3G. In some embodiments, the upper semiconductor portion $L_2$ is the main portion of each of the epitaxial structures. The upper semiconductor portion $L_2$ is larger than the bottom semiconductor portion $L_0$ or the lower semiconductor portion $L_1$. In some embodiments, the upper semiconductor portion $L_2$ extends upwards past the top surfaces and bottom surfaces of each of the semiconductor layers 104a-104d, as shown in FIG. 3G.

In some embodiments, each of the epitaxial structures 138 also includes multiple edge semiconductor portions $L_1'$. The edge semiconductor portions $L_1'$ are adjacent to the edges of the semiconductor layers 104a-104d. In some embodiments, each of the epitaxial structures 138 further includes a top semiconductor portion $L_3$ that is over the upper semiconductor portion $L_2$.

In some embodiments, the epitaxial structures 138 are designed to function as source/drain structures of n-channel field-effect transistors (NFET). In these cases, the main portion of the epitaxial structure 138 (such as the upper semiconductor portion $L_2$) is n-type doped. In some embodiments, the upper semiconductor portion $L_2$ of each of the epitaxial structures 138 is doped with one or more suitable n-type dopants. For example, the upper semiconductor portion $L_2$ of each of the epitaxial structures 138 is a Si source/drain feature that is doped with phosphor (P), antimony (Sb), arsenic (As), or another suitable dopant. The dopant concentration of the upper semiconductor portion $L_2$ may be in a range from about $10^{20}$ atoms/cm$^3$ to about $10^{22}$ atoms/cm$^3$.

In some embodiments, both the upper semiconductor portion $L_2$ and the top semiconductor portion $L_3$ are n-type doped. In some embodiments, the top semiconductor portion $L_3$ has a dopant concentration that is higher than that of the upper semiconductor portion $L_2$. Many variations and/or modifications can be made to embodiments of the disclosure. In some other embodiments, the top semiconductor portion $L_3$ is not formed.

In some embodiments, the upper semiconductor portion $L_2$ and the bottom semiconductor portion $L_0$ are oppositely doped. In some embodiments, the upper semiconductor portion $L_2$ is n-type doped, and the bottom semiconductor portion $L_0$ is p-type doped. For example, the bottom semiconductor portion $L_0$ of each of the epitaxial structures 138 is a SiGe source/drain feature or a Si source/drain feature that is doped with boron (B), gallium (Ga), indium (In), or another suitable dopant. The dopant concentration of the bottom semiconductor portion $L_0$ may be in a range from about $10^{18}$ atoms/cm$^3$ to about $10^{19}$ atoms/cm$^3$. The bottom semiconductor portion $L_0$ that is oppositely doped may help to reduce or to prevent the short channel effect.

In some embodiments, the upper semiconductor portion $L_2$ and the lower semiconductor portion $L_1$ are oppositely doped. In some embodiments, the upper semiconductor portion $L_2$ is n-type doped, and the lower semiconductor portion $L_1$ is p-type doped. For example, the lower semiconductor portion $L_1$ of each of the epitaxial structures 138 is a SiGe source/drain feature or a Si source/drain feature that is doped with boron (B), gallium (Ga), indium (In), or another suitable dopant. The dopant concentration of the lower semiconductor portion $L_1$ may be in a range from about $10^{18}$ atoms/cm$^3$ to about $10^{19}$ atoms/cm$^3$. In some embodiments, the dopant concentrations of the lower semiconductor portion $L_1$ and the bottom semiconductor portion $L_0$ are substantially equal to each other. Similar to the bottom semiconductor portion $L_0$, the lower semiconductor portion $L_1$ may help to reduce or to prevent the short channel effect.

In some embodiments, the upper semiconductor portion $L_2$ and the edge semiconductor portions $L_1'$ are oppositely doped. In some embodiments, the upper semiconductor portion $L_2$ is n-type doped, and the edge semiconductor portions $L_1'$ are p-type doped. For example, the edge semiconductor portions $L_1'$ of each of the epitaxial structures 138 are SiGe source/drain features or Si source/drain features that are doped with boron (B), gallium (Ga), indium (In), or another suitable dopant. The dopant concentration of the edge semiconductor portions $L_1'$ may be in a range from about $10^{18}$ atoms/cm$^3$ to about $10^{19}$ atoms/cm$^3$.

In some embodiments, the dopant concentrations of the edge semiconductor portions $L_1'$ and the bottom semiconductor portion $L_0$ are substantially equal to each other. In some embodiments, the edge semiconductor portions $L_1'$ and the lower semiconductor portion $L_1$ are formed simultaneously using the same epitaxial growth operation. In some embodiments, the dopant concentrations of the edge semiconductor portions $L_1'$ and the lower semiconductor portion $L_1$ are the same. In some embodiments, the compositions of the edge semiconductor portions $L_1'$ and the lower semiconductor portion $L_1$ are the same. Similar to the bottom semiconductor portion $L_0$ and the lower semiconductor portion $L_1$, the edge semiconductor portions $L_1'$ may help to reduce or to prevent the short channel effect.

In some embodiments, each of the edge semiconductor portions $L_1'$ is formed to have a thickness that is in a range from about 0.5 nm to about 5 nm. In some cases, if the thickness is smaller than about 0.5 nm, the short channel effect may not be sufficiently reduced. In some other cases, if the thickness is greater than about 5 nm, the resistance between the epitaxial structure 138 and the subsequently formed channel structures may be too high, which is also not desired in some embodiments.

Embodiments of the disclosure are not limited thereto. Many variations and/or modifications can be made to embodiments of the disclosure. In some other embodiments for NFETs, the bottom semiconductor portion $L_0$ is undoped, and the lower semiconductor portion $L_1$ and the edge semiconductor portions $L_1'$ are oppositely doped. In some embodiments, the upper semiconductor portion $L_2$ is n-type doped, and the lower semiconductor portion $L_1$ and the edge semiconductor portions $L_1'$ are p-type doped.

Embodiments of the disclosure are not limited thereto. Many variations and/or modifications can be made to embodiments of the disclosure. In some other embodiments for NFETs, the bottom semiconductor portion $L_0$ is oppositely doped, but the lower semiconductor portion $L_1$ and the edge semiconductor portions $L_1'$ are not. In some embodiments, the upper semiconductor portion $L_2$ is n-type doped, and the lower semiconductor portion $L_1$ and the edge semiconductor portions $L_1'$ are also n-type doped. In these cases, the bottom semiconductor portion $L_0$ is p-type doped. In some embodiments, the dopant concentration of the upper semiconductor portion $L_2$ is higher than that of the lower semiconductor portion $L_1$ and the edge semiconductor portions $L_1'$.

Embodiments of the disclosure are not limited thereto. Many variations and/or modifications can be made to embodiments of the disclosure. In some other embodiments, the epitaxial structures 138 are designed to function as source/drain structures of p-channel field-effect transistors (PFET). In these cases, the main portion of the epitaxial structure 138 (such as the upper semiconductor portion $L_2$) is p-type doped. In some embodiments, the upper semiconductor portion $L_2$ of each of the epitaxial structures 138 is doped with one or more suitable p-type dopants. For example, the upper semiconductor portion $L_2$ of each of the epitaxial structures 138 is a SiGe source/drain feature or a Si source/drain feature that is doped with boron (B), gallium (Ga), indium (In), or another suitable dopant. The dopant concentration of the upper semiconductor portion $L_2$ may be in a range from about $10^{20}$ atoms/cm$^3$ to about $10^{22}$ atoms/cm$^3$.

In some embodiments, both the upper semiconductor portion $L_2$ and the top semiconductor portion $L_3$ are p-type doped. In some embodiments, the top semiconductor portion $L_3$ has a dopant concentration that is higher than that of the upper semiconductor portion $L_2$. Many variations and/or modifications can be made to embodiments of the disclosure. In some other embodiments, the top semiconductor portion $L_3$ is not formed.

In some embodiments, the upper semiconductor portion $L_2$ and the bottom semiconductor portion $L_0$ are oppositely doped. In some embodiments, the upper semiconductor portion $L_2$ is p-type doped, and the bottom semiconductor portion $L_0$ is n-type doped. For example, the bottom semiconductor portion $L_0$ of each of the epitaxial structures 138 is a Si source/drain feature that is doped with phosphor (P), antimony (Sb), arsenic (As), or another suitable dopant. The dopant concentration of the bottom semiconductor portion $L_0$ may be in a range from about $10^{18}$ atoms/cm$^3$ to about $10^{19}$ atoms/cm$^3$. The bottom semiconductor portion $L_0$ that is oppositely doped may help to reduce or to prevent the short channel effect.

In some embodiments, the upper semiconductor portion $L_2$ and the lower semiconductor portion $L_1$ are oppositely doped. In some embodiments, the upper semiconductor portion $L_2$ is p-type doped, and the lower semiconductor portion $L_1$ is n-type doped. For example, the lower semiconductor portion $L_1$ of each of the epitaxial structures 138 is a Si source/drain feature that is doped with phosphor (P), antimony (Sb), arsenic (As), or another suitable dopant. The dopant concentration of the lower semiconductor portion $L_1$ may be in a range from about $10^{18}$ atoms/cm$^3$ to about $10^{19}$ atoms/cm$^3$. In some embodiments, the dopant concentrations of the lower semiconductor portion $L_1$ and the bottom semiconductor portion $L_0$ are substantially equal to each other. Similar to the bottom semiconductor portion $L_0$, the lower semiconductor portion $L_1$ may help to reduce or to prevent the short channel effect.

In some embodiments, the upper semiconductor portion $L_2$ and the edge semiconductor portions $L_1'$ are oppositely doped. In some embodiments, the upper semiconductor portion $L_2$ is p-type doped, and the edge semiconductor portions $L_1'$ are n-type doped. For example, the edge semiconductor portions $L_1'$ of each of the epitaxial structures 138 are Si source/drain features that are doped with phosphor (P), antimony (Sb), arsenic (As), or another suitable dopant. The dopant concentration of the edge semiconductor portions $L_1'$ may be in a range from about $10^{18}$ atoms/cm$^3$ to about $10^{19}$ atoms/cm$^3$.

In some embodiments, the dopant concentrations of the edge semiconductor portions $L_1'$ and the bottom semiconductor portion $L_0$ are substantially equal to each other. In some embodiments, the edge semiconductor portions $L_1'$ and the lower semiconductor portion $L_1$ are formed simultaneously using the same epitaxial growth operation. In some embodiments, the dopant concentrations of the edge semiconductor portions $L_1'$ and the lower semiconductor portion $L_1$ are the same. In some embodiments, the compositions of the edge semiconductor portions $L_1'$ and the lower semiconductor portion $L_1$ are the same. Similar to the bottom semiconductor portion $L_0$ and the lower semiconductor portion $L_1$, the edge semiconductor portions $L_1'$ may help to reduce or to prevent the short channel effect.

Embodiments of the disclosure are not limited thereto. Many variations and/or modifications can be made to embodiments of the disclosure. In some other embodiments for PFETs, the bottom semiconductor portion $L_0$ is undoped, and the lower semiconductor portion $L_1$ and the edge semiconductor portions $L_1'$ are oppositely doped. In some embodiments, the upper semiconductor portion $L_2$ is p-type doped, and the lower semiconductor portion $L_1$ and the edge semiconductor portions $L_1'$ are n-type doped.

Embodiments of the disclosure are not limited thereto. Many variations and/or modifications can be made to embodiments of the disclosure. In some other embodiments for PFETs, the bottom semiconductor portion $L_0$ is oppositely doped, but the lower semiconductor portion $L_1$ and the edge semiconductor portions $L_1'$ are not. In some embodiments, the upper semiconductor portion $L_2$ is p-type doped, and the lower semiconductor portion $L_1$ and the edge semiconductor portions $L_1'$ are also p-type doped. In these cases, the bottom semiconductor portion $L_0$ is n-type doped. In some embodiments, the dopant concentration of the upper semiconductor portion $L_2$ is higher than that of the lower semiconductor portion $L_1$ and the edge semiconductor portions $L_1'$.

In some embodiments, the epitaxial structures 138 are formed using multiple epitaxial growth operations. In some embodiments, these epitaxial growth operations are performed in-situ in the same process chamber. In some embodiments, the vacuum of the process chamber is not broken before the formation of the epitaxial structures 138 is accomplished. The reaction gases may be varied in the reaction chamber during the epitaxial growth operations.

These epitaxial growth operations may be achieved using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the formation of the epitaxial structures 138 involves one or more etching processes that are used to fine-tune the shapes of the epitaxial structures 138.

In some embodiments, the formation of the epitaxial structures 138 includes a first epitaxial growth operation that forms the bottom semiconductor portion $L_0$. A bottom-up epitaxial operation may be used to form the bottom semiconductor portion $L_0$. As a result, the bottom semiconductor portion $L_0$ is formed at the bottom portion of the recess 130. The epitaxially grown semiconductor material is substantially not grown on the edges of the semiconductor layers 104a-104d.

In some embodiments, the formation of the epitaxial structures 138 also includes a second epitaxial growth operation that is performed after the first epitaxial growth operation. The second epitaxial growth operation is used to form the lower semiconductor portion $L_1$ and the edge semiconductor portions $L_1'$. In some embodiments, the lower semiconductor portion $L_1$ and the edge semiconductor portions $L_1'$ are thus formed simultaneously and have the same composition.

In some embodiments, the formation of the epitaxial structures 138 further includes a third epitaxial growth operation that is performed after the second epitaxial growth operation. The third epitaxial growth operation is used to form the upper semiconductor portion $L_2$.

In some embodiments, the formation of the epitaxial structures 138 further includes a fourth epitaxial growth operation that is performed after the third epitaxial growth operation. The fourth epitaxial growth operation is used to form the top semiconductor portion $L_3$.

In some embodiments, each of different portions of the epitaxial structures 138 are doped in-situ during their epitaxial growth. The initial reaction gas mixture for forming the epitaxial structures 138 contains respective dopants. In some embodiments, the epitaxial structures 138 are further exposed to one or more annealing processes to activate the dopants. For example, a rapid thermal annealing process is used.

Afterwards, as shown in FIG. 3H, a contact etch stop layer 139 and a dielectric layer 140 are formed to cover the epitaxial structures 138 and to surround the dummy gate stacks 120A and 120B, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIG. 3H. The planarization process may include a CMP process, a grinding process, an etching process, a dry polishing process, one or more other applicable processes, or a combination thereof. In some embodiments, the mask layers 122 and 124 are removed during the planarization process. In some embodiments, after the planarization process, the top surfaces of the contact etch stop layer 139, the dielectric layer 140, and the dummy gate electrodes 118 are substantially level.

Figure 3J:
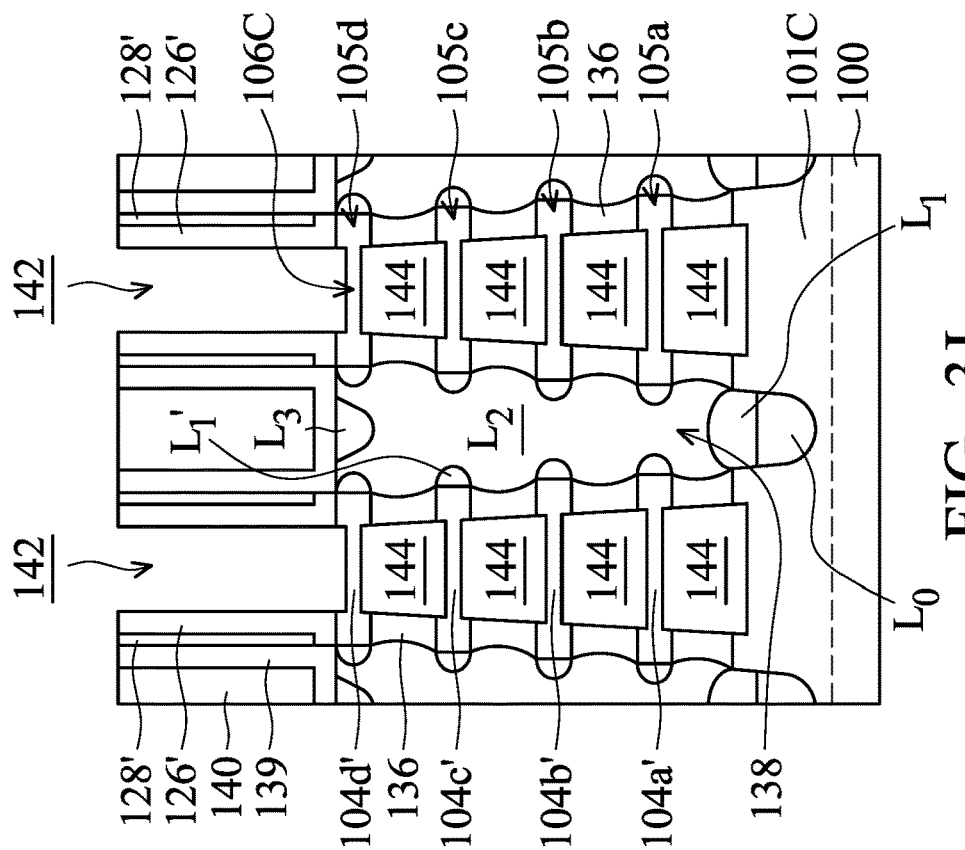
Figure 3I:
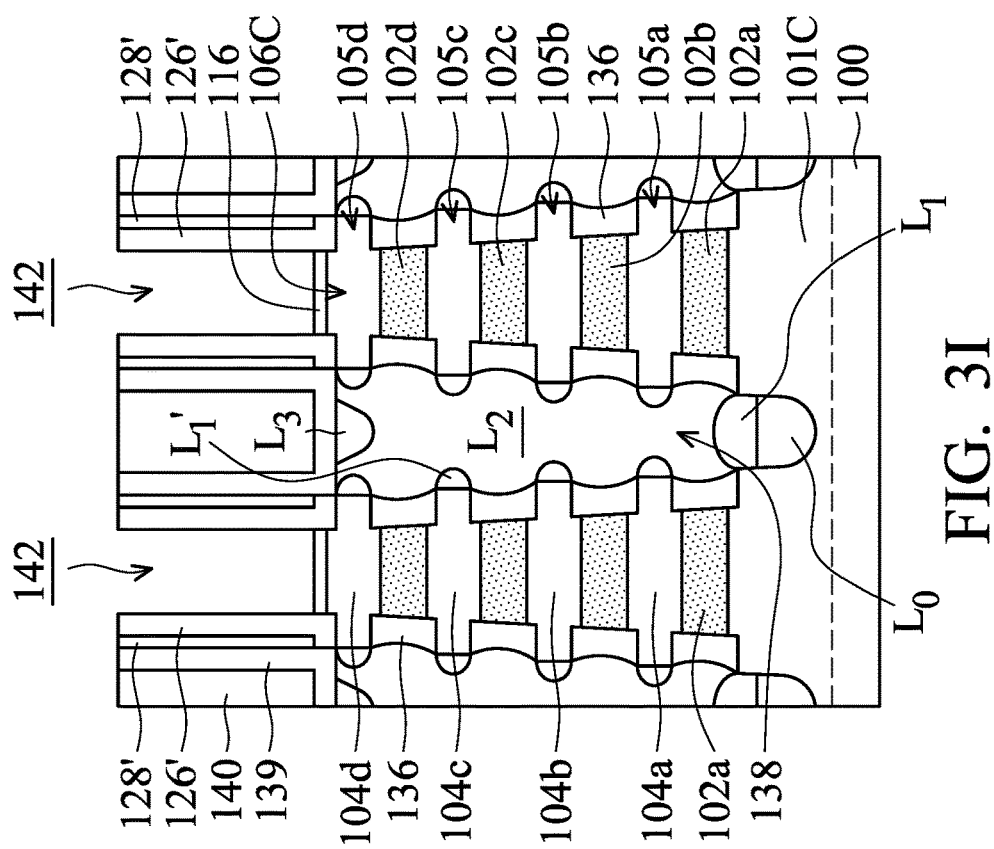

Afterwards, as shown in FIG. 3I, the dummy gate electrodes 118 are removed to form trenches 142 using one or more etching processes, in accordance with some embodiments. The trenches 142 are surrounded by the dielectric layer 140. The trenches 142 expose the dummy gate dielectric layer 116.

As shown in FIG. 3J, the dummy gate dielectric layer 116 and the semiconductor layers 102a-102d (that function as sacrificial layers) are removed, in accordance with some embodiments. In some embodiments, one or more etching processes are used to remove the dummy gate dielectric layer 116 and the semiconductor layers 102a-102d. As a result, recesses 144 are formed, as shown in FIG. 3J.

Due to high etching selectivity, the semiconductor layers 104a-104d are slightly (or substantially not) etched. The remaining portions of the semiconductor layers 104a-104d form multiple semiconductor nanostructures 104a'-104d'. The semiconductor nanostructures 104a'-104d' are constructed by or made up of the remaining portions of the semiconductor layers 104a-104d. The semiconductor nanostructures 104a'-104d' may function as channel structures of transistors.

In some embodiments, the etchant used for removing the semiconductor layers 102a-102d also slightly removes the semiconductor layers 104a-104d that form the semiconductor nanostructures 104a'-104d'. As a result, the obtained semiconductor nanostructures 104a'-104d' become thinner after the removal of the semiconductor layers 102a-102d. In some embodiments, each of the semiconductor nanostructures 104a'-104d' is thinner than the edge portions 105a-105d since the edge portions 105a-105d are surrounded by other elements and thus are prevented from being reached and etched by the etchant.

After the removal of the semiconductor layers 102a-102d (that function as sacrificial layers), the recesses 144 are formed. The recesses 144 connect to the trench 142 and surround each of the semiconductor nanostructures 104a'-104d'. As shown in FIG. 3J, even if the recesses 144 between the semiconductor nanostructures 104a'-104d' are formed, the semiconductor nanostructures 104a'-104d' remain being held by the epitaxial structures 138. Therefore, after the removal of the semiconductor layers 102a-102d (that function as sacrificial layers), the released semiconductor nanostructures 104a'-104d' are prevented from falling down.

During the removal of the semiconductor layers 102a-102d (that function as sacrificial layers), the inner spacers 136 protect the epitaxial structures 138 from being etched or damaged. The quality and reliability of the semiconductor device structure are improved.

As shown in FIG. 3K, metal gate stacks 156A and 156B are formed to fill the trenches 142, in accordance with some embodiments. The metal gate stacks 156A and 156B further extend into the recesses 144 to wrap around each of the semiconductor nanostructures 104a'-104d'.

Each of the metal gate stacks 156A and 156B includes multiple metal gate stack layers. Each of the metal gate stacks 156A and 156B may include a gate dielectric layer 150 and a metal gate electrode 152. The metal gate electrode 152 may include a work function layer. The metal gate electrode 152 may further include a conductive filling. In some embodiments, the formation of the metal gate stacks 156A and 156B involves the deposition of multiple metal gate stack layers over the dielectric layer 140 to fill the trenches 142 and the recesses 144. The metal gate stack layers extend into the recesses 144 to wrap around each of the semiconductor nanostructures 104a'-104d'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, interfacial layers are formed on the surfaces of the semiconductor nanostructures 104a'-104d'. The interfacial layers are very thin and are made of silicon oxide or germanium oxide, for example. In some embodiments, the interfacial layers are formed by applying an oxidizing agent on the surfaces of the semiconductor nanostructures 104a'-104d'. For example, a hydrogen peroxide-containing liquid may be provided or applied on the surfaces of the semiconductor nanostructures 104a'-104d' so as to form the interfacial layers.

The work function layer of the metal gate electrode 152 may be used to provide the desired work function for transistors to enhance device performance including improved threshold voltage. In some embodiments, the work function layer is used for forming a PMOS device. The work function layer is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

In some embodiments, the work function layer is used for forming an NMOS device. The work function layer is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electroless plating process, one or more other applicable processes, or a combination thereof. In some embodiments, the formation of the work function layer involves one or more patterning processes. As a result, the n-type work function layer and the n-type work function layer are selectively formed over respective regions.

In some embodiments, a barrier layer is formed before the work function layer to interface the gate dielectric layer 150 with the subsequently formed work function layer. The barrier layer may also be used to prevent diffusion between the gate dielectric layer 150 and the subsequently formed work function layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive fillings of the metal gate electrodes 152 are made of or include a metal material. The metal material may include tungsten, aluminum, copper, cobalt, one or more other suitable materials, or a combination thereof. A conductive layer used for forming the conductive filling may be deposited over the work function layer using a CVD process, an ALD process, a PVD process, an electroplating process, an electroless plating process, a spin coating process, one or more other applicable processes, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A and 156B, as shown in FIG. 3K.

In some embodiments, the conductive filling does not extend into the recesses 144 since the recesses 144 are small and have been filled with other elements such as the gate dielectric layer 150 and the work function layer. However, embodiments of the disclosure are not limited thereto. In some other embodiments, a portion of the conductive filling extends into the recesses 144, especially for the lower recesses 144 that may have larger space.

Afterwards, as shown in FIG. 3L, metal-semiconductor compound elements 162 and conductive contacts 164 are formed over the epitaxial structures 138, in accordance with some embodiments. The conductive contacts 164 may be made of or include cobalt, tungsten, ruthenium, one or more other suitable materials, or a combination thereof. The metal-semiconductor compound elements 162 may be made of or include titanium silicide, nickel silicide, cobalt silicide, titanium silicon germanium, one or more other suitable materials, or a combination thereof. The formation of the metal-semiconductor compound elements 162 and the conductive contacts 164 may involve one or more patterning processes, one or more deposition processes, one or more annealing processes, and one or more planarization processes.

Figure 4:
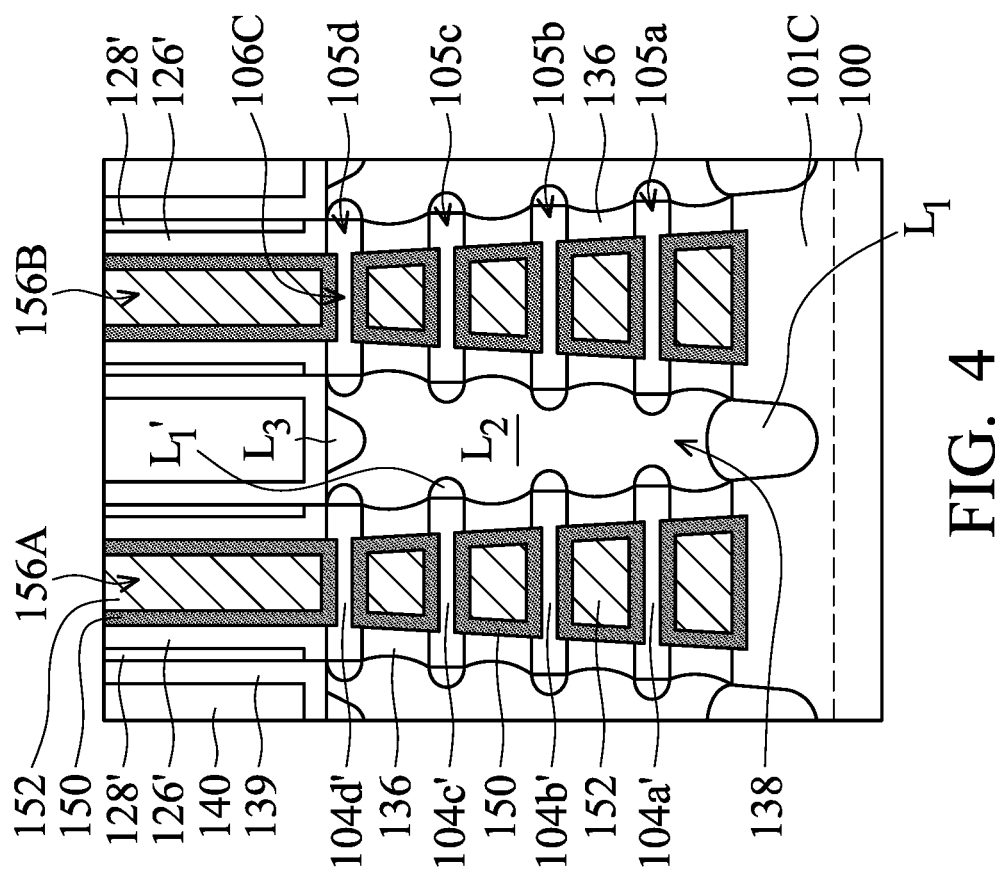
FIG. 4 is a cross-sectional view of an intermediate stage of a process for forming a portion of a semiconductor device structure, in accordance with some embodiments.

Many variations and/or modifications can be made to embodiments of the disclosure. FIG. 4 is a cross-sectional view of an intermediate stage of a process for forming a portion of a semiconductor device structure, in accordance with some embodiments. As shown in FIG. 4, a structure similar to the structure illustrated in FIG. 3K is formed. In some embodiments, unlike the embodiments shown in FIG.

3K, the bottom semiconductor portions $L_0$ of the epitaxial structures 138 are not formed, as shown in FIG. 4.

In some embodiments, the lower semiconductor portions $L_1$ extend to the bottommost portions of the recesses 142. In some embodiments, the lower semiconductor portions $L_1$ and the edge semiconductor portions $L_1'$ are oppositely doped, so as to reduce or prevent the short channel effect. In some embodiments, the upper semiconductor portions $L_2$ are n-type doped. The lower semiconductor portions $L_1$ and the edge semiconductor portions $L_1'$ are p-type doped. In some other embodiments, the upper semiconductor portions $L_2$ are p-type doped. The lower semiconductor portions $L_1$ and the edge semiconductor portions $L_1'$ are n-type doped.

In some embodiments, there are four channel structures (such as the semiconductor nanostructures 104a'-104d') stacked. However, embodiments of the disclosure are not limited thereto. Many variations and/or modifications can be made to embodiments of the disclosure. In some embodiments, the total number of the stacked semiconductor nanostructures is greater than four. In some other embodiments, the total number of the stacked semiconductor nanostructures is smaller than four. The total number of the stacked semiconductor nanostructures (or channel structures) may be fine-tuned to meet requirements. For example, the total number of the stacked semiconductor nanostructures may be 3 to 8. The semiconductor nanostructures may have many applicable profiles. The semiconductor nanostructures may include nanosheets, nanowires, or other suitable nanostructures.

Embodiments of the disclosure form a semiconductor device structure with epitaxial structures that have multiple portions that are doped in different manners. Some oppositely doped portions are used to reduce or prevent the short channel effect. Therefore, the performance and reliability of the semiconductor device structure may therefore be improved.

In accordance with some embodiments, a method for forming a semiconductor device structure is provided. The method includes forming a fin structure over a substrate. The fin structure has multiple sacrificial layers and multiple semiconductor layers, and the sacrificial layers and the semiconductor layers have an alternating configuration. The method also includes forming a gate stack to wrap a portion of the fin structure, and partially removing the fin structure to form a recess exposing edges of the semiconductor layers. The method further includes forming an epitaxial structure in the recess. The formation of the epitaxial structure includes forming a bottom semiconductor portion and forming a lower semiconductor portion on the bottom semiconductor portion. The formation of the epitaxial structure also includes forming a main semiconductor portion over the lower semiconductor portion. The main semiconductor portion and the bottom semiconductor portion are oppositely doped.

In accordance with some embodiments, a method for forming a semiconductor device structure is provided. The method includes forming a protruding structure over a substrate. The protruding structure has multiple sacrificial layers and multiple semiconductor layers, and the sacrificial layers and the semiconductor layers have an alternating configuration. The method also includes forming a gate stack to wrap a portion of the protruding structure. The method further includes forming an epitaxial structure abutting edges of the semiconductor layers. The formation of the epitaxial structure includes forming a lower semiconductor portion on a bottom of the recess and forming an upper semiconductor portion over the lower semiconductor portion. The upper semiconductor portion and the lower semiconductor portion are oppositely doped.

In accordance with some embodiments, a semiconductor device structure is provided. The semiconductor device structure includes multiple semiconductor nanostructures over a substrate and a gate stack wrapped around the semiconductor nanostructures. The semiconductor device structure also includes an epitaxial structure adjacent to the semiconductor nanostructures. The epitaxial structure includes a main portion and a lower portion below the main portion, and the main portion extends upwards beyond surfaces of the semiconductor nanostructures. The main portion and the lower portion are oppositely doped.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a fin structure over a substrate, wherein the fin structure has a plurality of sacrificial layers and a plurality of semiconductor layers, and the sacrificial layers and the semiconductor layers have an alternating configuration;
    forming a gate stack to wrap a portion of the fin structure;
    partially removing the fin structure to form a recess exposing edges of the semiconductor layers; and
    forming an epitaxial structure in the recess, wherein the formation of the epitaxial structure includes:
        forming a bottom semiconductor portion on a bottom of the recess,
        forming a lower semiconductor portion on the bottom semiconductor portion, and
        forming a main semiconductor portion over the lower semiconductor portion, wherein the main semiconductor portion and the bottom semiconductor portion are oppositely doped.

2. The method for forming a semiconductor device structure as claimed in claim 1, further comprising:
    forming a plurality of edge semiconductor portions on the edges of the semiconductor layers, wherein the edge semiconductor portions and the lower semiconductor portion are formed simultaneously.

3. The method for forming a semiconductor device structure as claimed in claim 2, wherein the main semiconductor portion and the edge semiconductor portions are oppositely doped.

4. The method for forming a semiconductor device structure as claimed in claim 3, wherein the main semiconductor portion and the lower semiconductor portion are oppositely doped, and dopant concentrations of the lower semiconductor portion and the edge semiconductor portions are the same.

5. The method for forming a semiconductor device structure as claimed in claim 1, wherein the main semiconductor portion and the lower semiconductor portion are oppositely doped.

6. The method for forming a semiconductor device structure as claimed in claim 1, wherein the bottom semiconductor portion and the lower semiconductor portion are oppositely doped.

7. The method for forming a semiconductor device structure as claimed in claim 1, further comprising:
forming inner spacers on edges of the sacrificial layers after the formation of the recess and before the formation of the epitaxial structure;
removing the gate stack and the sacrificial layers to form a plurality of semiconductor nanostructures made of remaining portions of the semiconductor layers; and
forming a metal gate stack to wrap around the semiconductor nanostructures.

8. The method for forming a semiconductor device structure as claimed in claim 1, wherein the formation of the epitaxial structure further includes:
forming an upper semiconductor portion over the main semiconductor portion, wherein the upper semiconductor portion and the bottom semiconductor portion are oppositely doped.

9. The method for forming a semiconductor device structure as claimed in claim 8, wherein the main semiconductor portion has a first dopant concentration, the upper semiconductor portion has a second dopant concentration, and the second dopant concentration is higher than the first dopant concentration.

10. The method for forming a semiconductor device structure as claimed in claim 1, wherein the main semiconductor portion has a first dopant concentration, the lower semiconductor portion has a third dopant concentration, and the first dopant concentration is higher than the third dopant concentration.

11. A method for forming a semiconductor device structure, comprising:
forming a protruding structure over a substrate, wherein the protruding structure has a plurality of sacrificial layers and a plurality of semiconductor layers, and the sacrificial layers and the semiconductor layers have an alternating configuration;
forming a gate stack to wrap a portion of the protruding structure; and
forming an epitaxial structure abutting edges of the semiconductor layers, wherein the formation of the epitaxial structure includes:
forming a lower semiconductor portion, and
forming an upper semiconductor portion over the lower semiconductor portion, wherein the upper semiconductor portion and the lower semiconductor portion are oppositely doped.

12. The method for forming a semiconductor device structure as claimed in claim 11, further comprising:
forming a plurality of edge semiconductor portions on the edges of the semiconductor layers, wherein the edge semiconductor portions and the lower semiconductor portion are formed simultaneously.

13. The method for forming a semiconductor device structure as claimed in claim 12, wherein the upper semiconductor portion and the edge semiconductor portions are oppositely doped.

14. The method for forming a semiconductor device structure as claimed in claim 11, further comprising:
forming a bottom semiconductor portion on a bottom of the recess before the formation of the lower semiconductor portion, wherein the bottom semiconductor portion is undoped.

15. The method for forming a semiconductor device structure as claimed in claim 11, further comprising:
forming a bottom semiconductor portion on a bottom of the recess before the formation of the lower semiconductor portion, wherein the bottom semiconductor portion and the upper semiconductor portion are oppositely doped.

16. A method for forming a semiconductor device structure, comprising:
forming a plurality of sacrificial layers and a plurality of semiconductor layers on a substrate, wherein the sacrificial layers and the semiconductor layers have an alternating configuration;
partially removing the sacrificial layers and the semiconductor layers to form a recess exposing edges of the semiconductor layers; and
forming an epitaxial structure in the recess, wherein the formation of the epitaxial structure includes:
forming a lower semiconductor portion on a bottom of the recess, and
forming a main semiconductor portion over the lower semiconductor portion, wherein the main semiconductor portion and the lower semiconductor portion are oppositely doped.

17. The method for forming a semiconductor device structure as claimed in claim 16, further comprising:
forming a plurality of edge semiconductor portions on the edges of the semiconductor layers.

18. The method for forming a semiconductor device structure as claimed in claim 17, wherein the edge semiconductor portions and the lower semiconductor portion are formed simultaneously.

19. The method for forming a semiconductor device structure as claimed in claim 17, wherein the main semiconductor portion and the edge semiconductor portions are oppositely doped.

20. The method for forming a semiconductor device structure as claimed in claim 16, wherein the main semiconductor portion is n-type doped.

* * * * *